United States Patent
Choi et al.

(10) Patent No.: US 7,376,039 B2
(45) Date of Patent: May 20, 2008

(54) CIRCUIT AND METHOD FOR PRESERVING DATA IN SLEEP MODE OF SEMICONDUCTOR DEVICE USING TEST SCAN CHAIN

(75) Inventors: Jin-Hyeok Choi, Yongin-si (KR); Sam-Yong Bahng, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 636 days.

(21) Appl. No.: 11/061,903

(22) Filed: Feb. 18, 2005

(65) Prior Publication Data

US 2005/0202855 A1    Sep. 15, 2005

(30) Foreign Application Priority Data

Mar. 13, 2004    (KR) .................. 10-2004-0017161

(51) Int. Cl.
  *G11C 5/14*    (2006.01)
(52) U.S. Cl. .................. 365/228; 365/229; 365/233
(58) Field of Classification Search ................ 365/228, 365/233, 201; 265/229; 713/324
  See application file for complete search history.

(56) References Cited

U.S. PATENT DOCUMENTS

| | | | |
|---|---|---|---|
| 6,256,252 B1 | 7/2001 | Arimoto | |
| 6,310,491 B1 | 10/2001 | Ogawa | |
| 6,433,586 B2 | 8/2002 | Ooishi | |
| 7,058,834 B2 * | 6/2006 | Woods et al. | 713/324 |
| 7,269,780 B2 * | 9/2007 | Arima et al. | 714/764 |

* cited by examiner

*Primary Examiner*—Son Dinh
(74) *Attorney, Agent, or Firm*—F. Chau & Associates, LLC

(57) ABSTRACT

A data storage circuit and a data preservation method for preserving data when a semiconductor device is in a sleep mode using a test scan chain are provided, where the data storage circuit includes a sleep mode control unit and a scan chain unit, the sleep mode control unit outputs a scan control signal and a scan clock signal in response to one of a test control signal and a sleep mode control signal received from the outside, stores an output data signal in a memory when the output data signal is received, and outputs a test pattern data signal as a scan data signal when the test pattern data signal is received, the scan chain unit outputs a normal data signal stored inside of the scan chain unit as the output data signal to the sleep mode control unit or receives and outputs the scan data signal to a combinational circuit unit in response to the scan control signal and the scan clock signal, and the data storage circuit and the data preservation method prevent a loss of data in a sleep mode of a semiconductor device, and reduce power consumption in a standby state.

27 Claims, 9 Drawing Sheets

CIRCUIT AND METHOD FOR PRESERVING DATA IN SLEEP MODE OF SEMICONDUCTOR DEVICE USING TEST SCAN CHAIN

CROSS-REFERENCE TO RELATED APPLICATION

This application claims foreign priority under 35 U.S.C. § 119 to Korean Patent Application No. 2004-17161, filed on Mar. 13, 2004, in the Korean Intellectual Property Office, the disclosure of which is incorporated herein by reference in its entirety.

BACKGROUND OF THE INVENTION

1. Field of the Invention

The present disclosure relates to semiconductor devices, and more particularly, to methods for controlling sleep modes of semiconductor devices.

2. Description of the Related Art

Some semiconductor devices include a sleep mode function. In order to reduce power consumption of a semiconductor device, a control system may apply a control signal to a semiconductor chip that is expected not to operate for a period of time, thus placing the semiconductor device into a sleep mode. A sleep mode is also sometimes referred to as a standby mode or state, a stop mode, or a power down mode. In each mode, the level of source voltage applied to the semiconductor device is reduced. When a semiconductor device is used in a portable device, a sleep mode function of the semiconductor device has a great effect on reducing power consumption of the portable device. An example of a conventional semiconductor device having a sleep mode function is disclosed in U.S. Pat. No. 6,137,744.

On the other hand, a semiconductor device in a sleep mode can be placed back to an active mode when required. When switching from a sleep mode into an active mode, a semiconductor device has to return to a state prior to the switch to sleep mode, and operate normally. Generally, when a semiconductor device operates in a normal mode, data generated by internal combinational circuits is stored in a temporary memory space such as internal flip-flops. However, since power sources supplied to most of the circuits in the semiconductor device are cut when the semiconductor device is switched to the sleep mode, the data stored in the flip-flops is lost. Accordingly, when such a semiconductor device is switched again from a sleep mode to an active mode, the semiconductor device cannot recover its previous state and does not operate properly.

The problem described above can be solved if the flip-flops are not placed in a sleep mode even if the semiconductor device is placed in the sleep mode. However, a solution as described above may restrict any reduction of power consumption when the semiconductor device is in the standby state. In order to prevent data loss and reduce power consumption of the semiconductor device in a standby state when entering a sleep mode, the semiconductor device can store data in an additional storage space and be switched to a sleep mode. However, in this case, since the semiconductor device has to include additional circuits for storing the data, such as circuits forming a path in which the data is transferred to a storage space such as a memory, the manufacturing cost of the semiconductor device is increased.

SUMMARY OF THE INVENTION

The present disclosure provides a data storage circuit that stores data generated by internal circuits using a scan chain used for testing and then is switched to a sleep mode, thereby preventing data loss and reducing power consumption in a standby state.

The present disclosure also provides a data preservation method that stores data generated by internal circuits using a test scan chain and switches to a sleep mode, thereby preventing a loss of data and reducing power consumption in a standby state.

According to an aspect of the present disclosure, there is provided a data storage circuit which preserves data when the semiconductor device is in a sleep mode, the data storage circuit comprising: a sleep mode control unit which outputs a scan control signal and a scan clock signal in response to one of a test control signal and a sleep mode control signal received from the outside, stores an output data signal in a memory when the output data signal is received, and outputs a test pattern data signal as a scan data signal when the test pattern data signal is received; and a scan chain unit, in response to the scan control signal and the scan clock signal, which outputs to the sleep mode control unit, a normal data signal stored inside of the scan chain unit as the output data signal or receives and outputs the scan data signal to a combinational circuit unit.

According to another aspect of the present disclosure, there is provided a data storage circuit which preserves data when the semiconductor device is in a sleep mode, the data storage circuit comprising: a sleep mode control unit which outputs a scan control signal and a scan clock signal in response to one of a test control signal and a sleep mode control signal received from the outside, stores an output data signal in a memory when the output data signal is received, and outputs a first test pattern data signal as a scan data signal when the first test pattern data signal is received; a first scan chain unit which outputs a normal data signal stored inside of the first scan chain unit as the output data signal to the sleep mode control unit in response to the scan control signal and the scan clock signal or receives and outputs the scan data signal to a combinational circuit unit; second scan chain units which store second to Jth (where J is an integral number) test pattern data signals in response to the test control signal and an external clock signal, output the stored second to Jth test pattern data signals to second combinational circuit units, respectively, and output test result data signals received respectively from the second combinational circuit units to the outside via output pads.

According to still another aspect of the present disclosure, there is provided a data preservation method in which data is preserved when the semiconductor device is in a sleep mode, the method comprising the operations of: when a sleep mode control signal is enabled, a data storage circuit storing data signals received from a scan chain unit in a memory; when all the data signals are stored in the memory, the data storage circuit stopping applying a ground voltage to the scan chain unit and a combinational circuit unit; when the sleep mode control signal is disabled, the data storage circuit applying the ground voltage to the scan chain unit and the combinational circuit unit; after the operation of applying the ground voltage, the data storage circuit reading the data signals stored in the memory and outputting the data signals to the scan chain unit.

According to yet another aspect of the present disclosure, there is provided a data preservation method in which data is preserved when the semiconductor device is in a sleep mode, the method comprising the operations of: when a sleep mode control signal is enabled, a data storage circuit stopping applying a ground voltage to first scan chain units and first combinational circuit units; when a sleep mode control signal is enabled, the data storage circuit storing data signals received from a second scan chain unit in a memory; when all the data signals are stored in the memory, the data storage circuit stopping applying a ground voltage to the second scan chain unit and a second combinational circuit unit; when the sleep mode control signal is disabled, the data storage circuit applying the ground voltage to the first scan chain units and the second scan chain unit, and the first combinational circuits and the second combinational circuit; after the operation of applying the ground voltage, the data storage circuit reading the data signals stored in the memory and outputting the data signals to the second scan chain unit.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF PREFERRED EMBODIMENTS

Figure 1:
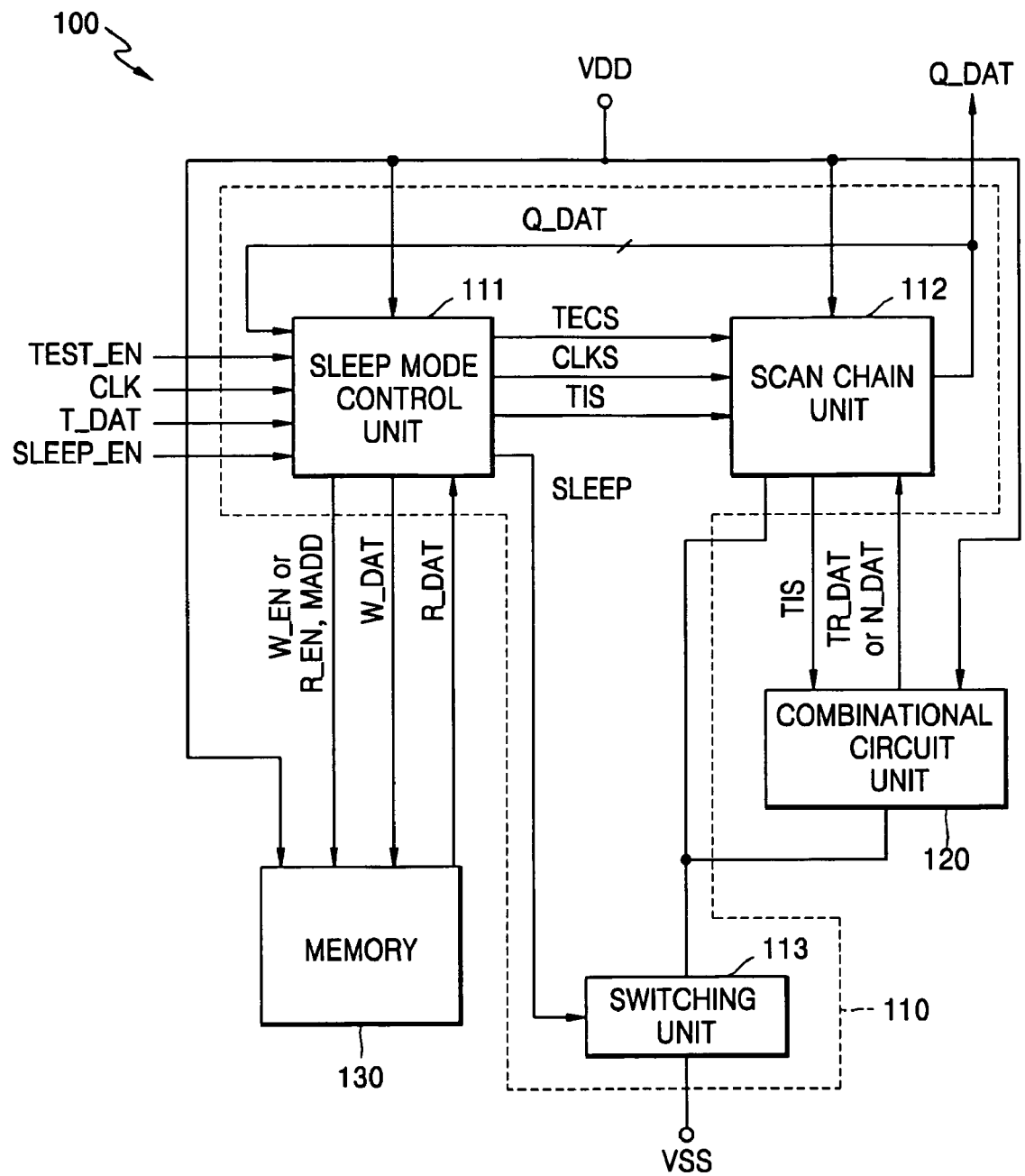
FIG. 1 is a block diagram illustrating a semiconductor device including a data storage circuit to preserve data in a sleep mode of a semiconductor device, according to an embodiment of the present disclosure.

The attached drawings for illustrating preferred embodiments of the present disclosure are referred to in order to gain a sufficient understanding of representative embodiments, the merits thereof, and the features of implementations of the present disclosure.

Hereinafter, the present disclosure will be described in detail by explaining preferred embodiments of the disclosure with reference to the attached drawings. Like reference numerals in the drawings may denote like elements.

FIG. 1 is a block diagram illustrating a semiconductor device including a data storage circuit to preserve data in a sleep mode of the semiconductor device, according to an embodiment of the present disclosure. Referring to FIG. 1, a semiconductor device 100 includes a data storage circuit 110, a combinational circuit unit 120, and a memory 130. Although the semiconductor device 100 can further include additional circuits, the additional circuits are omitted for clarity in the drawing.

The same internal voltage VDD is applied to the data storage circuit 110, the combinational circuit unit 120, and the memory 130. The data storage circuit 110 includes a sleep mode control unit 111, a scan chain unit 112, and a switching unit 113. The sleep mode control unit 111 responds to one of a test control signal TEST_EN and a sleep mode control signal SLEEP_EN received from the outside, and outputs a scan control signal TECS and a scan clock signal CLKS. When the sleep mode control unit 111 receives a test pattern data signal T_DAT from the outside, it outputs the test pattern data signal T_DAT as a scan data signal TIS to the scan chain unit 112. When the sleep mode control unit 111 receives an output data signal Q_DAT from the scan chain unit 112, the sleep mode control unit 111 stores the received output data signal Q_DAT in the memory 130. To store the output data signal Q_DAT in the memory 130, the sleep mode control unit 111 outputs a write control signal W_EN and an address signal MADD to the memory 130 and outputs the output data signal Q_DAT as a write data signal W_DAT to the memory 130. When being switched from a sleep mode to a normal operation mode, the sleep mode control unit 111 outputs a read control signal R_EN and the address signal MADD to the memory 130 and outputs a read data signal R_DAT received from the memory 130 as the scan data signal TIS to the scan chain unit 112.

In response to the sleep mode control signal SLEEP_EN, the sleep mode control unit 111 outputs a switching control signal SLEEP. The sleep mode control unit 111 will be described in detail referring to FIG. 2.

The scan chain unit 112 is a circuit embedded previously in the semiconductor device 100 in a manufacturing process of the semiconductor device 100 in order to test whether the semiconductor device 100 operates normally. In response to the scan control signal TECS and the scan clock signal CLKS, the scan chain unit 112 outputs a normal data signal N_DAT as the output data signal Q_DAT to the sleep mode control unit 111 or stores the scan data signal TIS received from the sleep mode control unit 111 and outputs the scan data signal TIS to the combinational circuit unit 120. Here, the normal data signal N_DAT is outputted from the combinational circuit unit 120 while the semiconductor device 100 operates normally.

When the semiconductor device 100 is in a test mode, that is, when the test control signal TEST_EN is enabled, the scan chain unit 112 receives a test result data signal TR_DAT that is outputted from the combinational circuit unit 120 in response to the scan data signal TIS and outputs the test result data signal TR_DAT to the outside via an output pad (not shown). The scan chain unit 112 will be described in detail with reference to FIG. 3.

The switching unit 113 is turned on or off in response to the switching control signal SLEEP and cuts off the ground voltage VSS applied to the scan chain unit 112 and the combinational circuit unit 120 when it is turned off. As a result, the scan chain unit 112 and the combinational circuit unit 120 stop operation and are switched to a standby mode.

Figure 2:
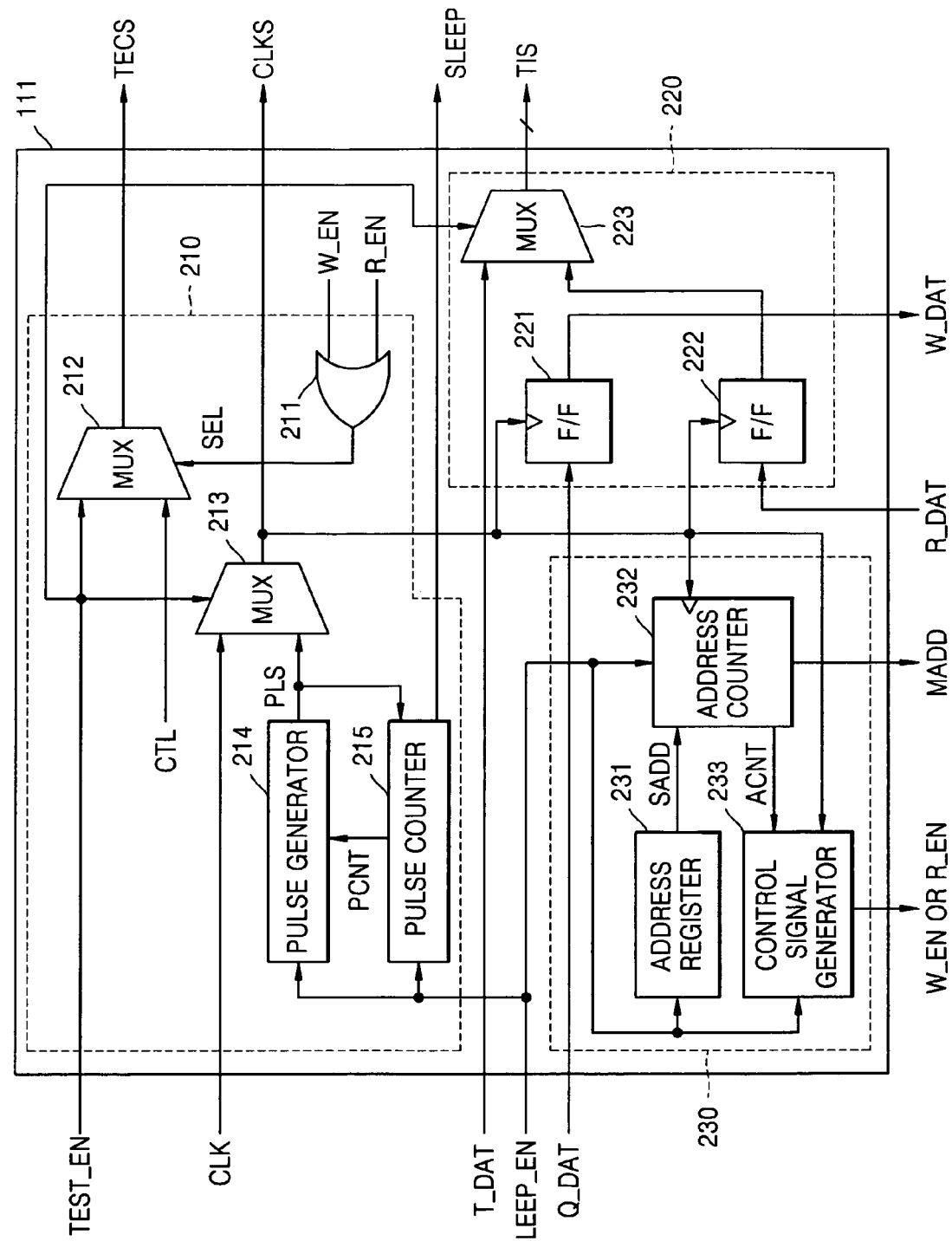
FIG. 2 is a diagram illustrating in detail a sleep mode control unit of FIG. 1.

FIG. 2 is a diagram illustrating in detail the sleep mode control unit 111 of FIG. 1. Referring to FIG. 2, the sleep mode control unit 111 includes a mode switching control unit 210, a data output unit 220, and a memory control unit 230. The mode switching control unit 210 includes an OR gate 211, multiplexers 212 and 213, a pulse generator 214, and a pulse counter 215. The OR gate 211 enables a selection signal SEL and outputs the selection signal SEL when one of the write control signal W_EN and the read control signal R_EN is enabled. In response to the selection signal SEL, the multiplexer 212 selects and outputs one of the test control signal TEST_EN and a control signal CTL as the scan control signal TECS. In more detail, when the selection signal SEL is enabled, the multiplexer 212 selects the control signal CTL and outputs the control signal CTL as the scan control signal TECS, and when the selection signal SEL is disabled, the multiplexer 212 selects the test control signal TEST_EN and outputs the test control signal TEST_EN as the scan control signal TECS. Here, the control signal CTL is generated by an additional control signal generation circuit (not shown) and has an internal voltage level VDD.

In response to the test control signal TEST_EN, the multiplexer 213 selects and outputs one of the external clock signal CLK and a pulse signal PLS as the scan clock signal CLKS. In more detail, when the test control signal TEST_EN is enabled, the multiplexer 213 selects the external clock signal CLK and outputs the external clock signal CLK as the scan clock signal CLKS; and when the test control signal TEST_EN is disabled, the multiplexer 213 selects the pulse signal PLS and outputs the pulse signal PLS as the scan clock signal CLKS.

The pulse generator 214 generates the pulse signal PLS in response to the sleep mode control signal SLEEP_EN, and stops generating the pulse signal PLS in response to a pulse stop signal PCNT. In more detail, when the sleep mode control signal SLEEP_EN is transited, that is, when a rising edge or a falling edge is detected, the pulse generator 214 starts generating the pulse signal PLS.

The pulse counter 215 counts times the pulse signal PLS is output, accumulates the counting value, and outputs the pulse stop signal PCNT when the accumulated counting value reaches a predetermined value.

Also, the pulse counter 215 outputs the switching control signal SLEEP, in response to the sleep mode control signal SLEEP_EN and the pulse signal PLS. In more detail, when the sleep mode control signal SLEEP_EN is enabled and the accumulated counting value reaches a predetermined value, the pulse counter 215 disables the switching control signal SLEEP. When the sleep mode control signal SLEEP_EN is disabled, the pulse counter 215 enables the switching control signal SLEEP.

The data output unit 220 includes flip-flops 221 and 222 and a multiplexer 223. In response to the scan clock signal CLKS, the flip-flop 221 stores the output data signal Q_DAT received from the scan chain unit 112 and outputs the output data signal Q_DAT as a write data signal W_DAT to the memory 130. In response to the scan clock signal CLKS, the flip-flop 222 stores a read data signal R_DAT received from the memory 130 and outputs the read data signal R_DAT to the multiplexer 223. In response to the test control signal TEST_EN, the multiplexer 223 outputs one of the test pattern data signal T_DAT and the read data signal R_DAT received from the flip-flop 222 as the scan data signal TIS to the scan chain unit 112. In more detail, when the test control signal TEST_EN is enabled, the multiplexer 223 selects and outputs the test pattern data signal T_DAT as the scan data signal TIS, and when the test control signal TEST_EN is disabled, the multiplexer 223 selects and outputs the read data signal R_DAT as the scan data signal TIS.

The memory control unit 230 includes an address register 231, an address counter 232, and a control signal generator 233. The address register 231 stores a start address signal SADD, and when the sleep mode control signal SLEEP_EN is transited, the address register 231 outputs the start address signal SADD. Here, the start address signal SADD indicates storage cells (not shown) of the memory 130 in which the output data signal Q_DAT of the scan chain unit 112 is initially stored. The start address signal SADD stored in the address register 231 may be designated as a specific address of the memory 130. However, for example, when a microprocessor (not shown) recognizes a data storing state of the memory 130 and stores in the address register 231 on all such occasions a specific address signal of an address in which data is not stored in the memory 130, the start address signal SADD may be changed.

In response to the sleep mode control signal SLEEP_EN and the scan clock signal CLKS, the address counter 232 generates the address signal MADD based on the start address signal SADD, and generates a memory control stop signal ACNT in response to the scan clock signal CLKS. To describe in more detail, when the sleep mode control signal SLEEP_EN is transited, after a first cycle of the scan clock signal CLKS, the address counter 232 sequentially outputs the address signal MADD gradually increased from the start address signal SADD every cycle of the scan clock signal CLKS. For example, supposing that the start address signal SADD is 100, the address counter 232 outputs the address signal MADD of 100, 101, 102, . . . synchronizing the scan clock signal CLKS.

On the other hand, the scan chain unit 112 receives and stores the normal data signal N_DAT from the combinational circuit unit 120 during a first cycle of the scan clock signal CLKS.

The address counter 232 counts the times the address signal MADD is output, accumulates the counting value, and outputs the memory control stop signal ACNT when an accumulated counting value reaches a predetermined value.

In response to the sleep mode control signal SLEEP_EN and the scan clock signal CLKS, the control signal generator 233 enables one of the write control signal W_EN and the read control signal R_EN. In addition, in response to the memory control stop signal ACNT, the control signal generator 233 disables one of the write control signal W_EN and the read control signal R_EN, which is enabled. In further detail, when the sleep mode control signal SLEEP_EN is enabled, after a first cycle of the scan clock signal CLKS, the control signal generator 233 enables the write control signal W_EN; and when the memory control stop signal ACNT is received, the control signal generator 233 disables the write control signal W_EN. In addition, when the sleep mode control signal SLEEP_EN is disabled, the control signal generator 233 enables the read control signal R_EN; and when the memory control stop signal ACNT is received, the control signal generator 233 disables the read control signal R_EN.

Figure 3:
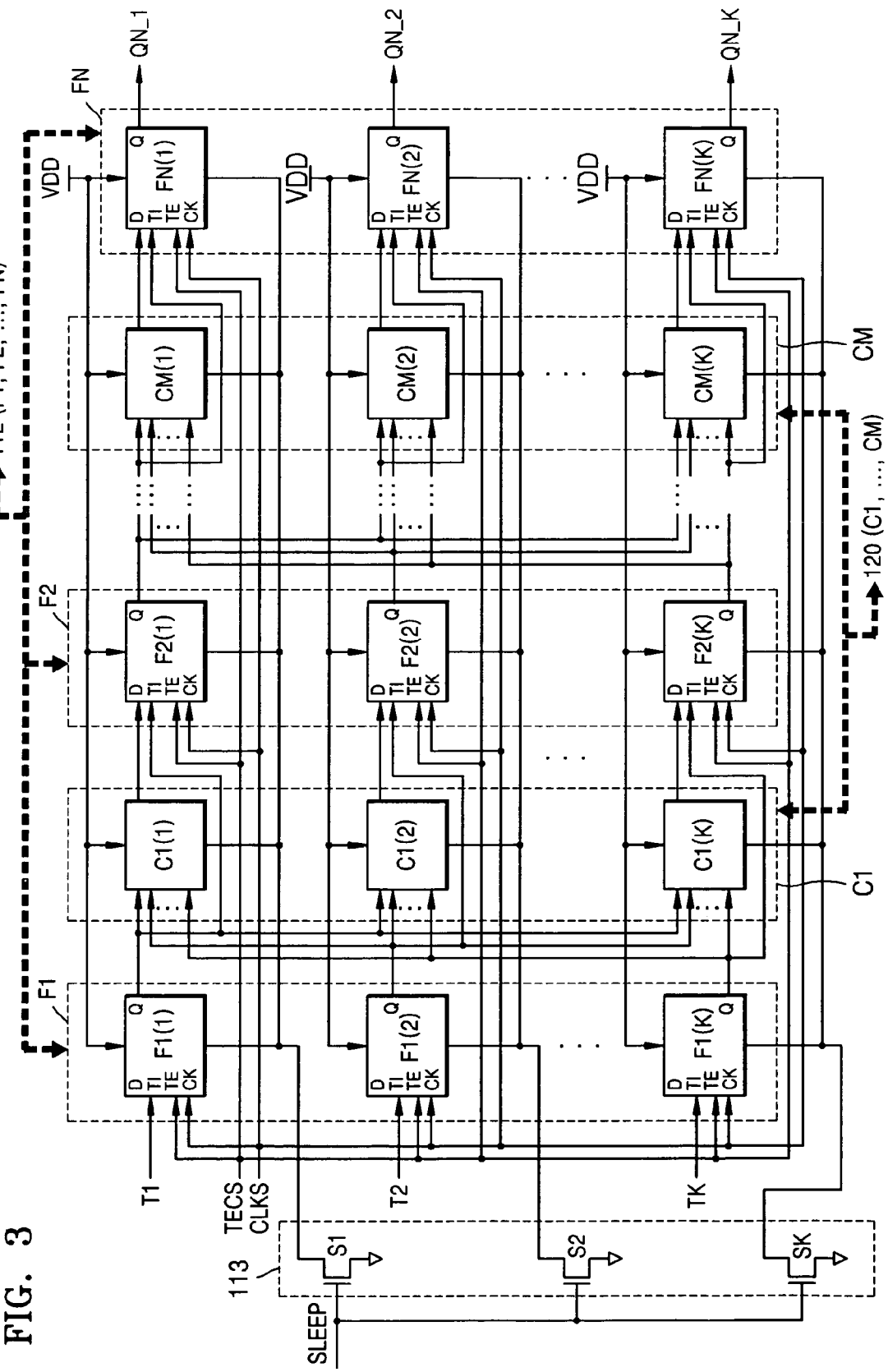
FIG. 3 is a diagram illustrating in detail a scan chain unit, a combinational circuit unit, and a switching unit of FIG. 1.

FIG. 3 is a diagram illustrating in detail the scan chain unit 112, the combinational circuit unit 120, and the switching unit 113 of FIG. 1. Referring to FIG. 3, the combinational circuit unit 120 includes a plurality of combinational circuit groups C1 through CM (where M is an integral number). The plurality of combinational circuit groups C1 through CM includes a plurality of combinational circuits C1(1) through CM(K). In more detail, the combinational circuit group C1 includes the combinational circuits C1(1) through C1 (K), the combinational circuit group C2 includes the combinational circuits C2(1) through C2(K) (not shown), and the combinational circuit group CM includes the combinational circuits CM(1) through CM(K).

The scan chain unit 112 includes a plurality of scan chain circuits F1 through FN (where N is an integral number) consecutively connected to form a chain. The scan chain circuits F1 through FN include a plurality of flip-flops F1(1) through FN(K) (where K is an integral number). In more detail, the scan chain circuit F1 includes the flip-flops F1(1) through F1(K), the scan chain circuit F2 includes the flip-flops F2(1) through F2(K), and the scan chain circuit FN includes the flip-flops FN(1) through FN(K). Output terminals Q of the flip-flops F1(1) through F1(K) are connected to input terminals TI of the flip-flops F2(1) through F2(K); and output terminals Q of the flip-flops F2(1) through F2(K) are connected to input terminals TI of the flip-flops (not shown) of the scan chain circuit F3. The scan chain circuits F3 through FN are consecutively connected similarly.

The plurality of the combinational circuit groups C1 through CM are alternately arranged between the scan chain circuits F1 through FN. That is, the scan chain circuits F1 through FN and the combinational circuit groups C1 through CN are alternately placed.

An input terminal D of each of the flip-flops F1(1) through F1(K) of the scan chain circuit F1 is not used, and bits T1 through TK (where K is an integral number) of the scan data signal TIS are inputted to input terminals TI of the respective flip-flops. Here, the number of flip-flops included in a scan chain circuit can be changed according to the number of bits of the scan data signal TIS. Also, the flip-flops F1(1) through F1(K) store the received bits T1 through TK respectively and output the stored bits T1 through TK, respectively, as bits Q1_1 through Q1_K of an output data signal Q DAT1 (not shown) via output terminals Q to the combinational circuits C1(1) through C1 (K) and the flip-flops F2(1) through F2(K) of the scan chain circuit F2.

Bits TD1_1 through TD1_K of a test result data signal TR_DAT1 (not shown) or bits ND1_1 through ND1_K of a normal data signal N_DAT1 (not shown) outputted from the combinational circuits C1(1) through C1(K) are inputted to input terminals D of the flip-flops F2(1) through F2(K), respectively, of the scan chain circuit F2. Also, bits Q1_1 through Q1_K of an output data signal Q_DAT1 (not shown) of the flip-flops F1(1) through F1(K) of the scan chain circuit F1 are inputted to input terminals TIs of the flip-flops F2(1) through F2(K), respectively, of the scan chain circuit F2. The flip-flops F2(1) through F2(K) store the received bits TD11 through TD1_K, ND1_1 through ND1_K, or Q1_1 through Q1_K, respectively, and output the stored bits TD1_1 through TD1_K, ND1_1 through ND1_K, or Q1_1 through Q1_K as bits Q2_1 through Q2_K, respectively, of an output data signal Q_DAT2 (not shown) via input terminals Q to the combinational circuits C2(1) through C2(K) and the flip-flops F3(1) through F3(K) of the scan chain circuit F3. Similarly, bits TDM1_1 through TDM_K of a test result data signal TR_DATM (not shown) or bits NDM_1 through NDM_K of a normal data signal N_DATM (not shown) outputted from the combinational circuits CM(1) through CM(K) are inputted to input terminals D of the flip-flops FN(1) through FN(K) of the scan chain circuit FN, respectively. Bits Q(N−1)_1 through Q(N−1)_K of an output data signal Q_DAT(N−1) (not shown) of the flip-flops F(N−1)(1) through F(N−1)(k) of the scan chain circuit F(N−1) are inputted to input terminals TIs of the flip-flops FN(1) through FN(K) of the scan chain circuit F(N), respectively. The flip-flops FN(1) through FN(K) store the received bits TDM_1 through TDM_K, NDM_1 through NDM_K, or Q(N−1)_1 through Q(N−1)_K, respectively, and output the stored bits TDM_1 through TDM_K, NDM_1 through NDM_K, or Q(N−1)_1 through Q(N−1)_K as bits QN_1 through QN_K, respectively, of an output data signal Q_DATN (not shown) via output terminals Q.

In addition, the scan control signal TECS is inputted to all input terminals TE of the flip-flops F1(1) through FN(K), and the scan clock signal CLKS is inputted to all input terminals CK of the flip-flops F1(1) through FN(K). The flip-flops F1(1) through FN(K) store a signal inputted to the input terminals D in synchronization with the scan clock signal CLKS when the scan control signal TECS is enabled and store a signal inputted to the input terminal TI in synchronization with the scan clock signal CLKS when the scan control signal TECS is disabled.

The switching unit 113 includes a plurality of switching circuits S1 through SK (where K is an integral number). The plurality of switching circuits S1 through SK are turned on or off in response to the switching control signal SLEEP. When the plurality of switching circuits S1 through SK are turned off, ground voltage VSS is no longer applied to the flip-flops F1(1) through FN(K) and the combinational circuits C1(1) through CM(K).

For example, the switching circuit S1 is connected to the flip-flops F1(1) through FN(1) and the combinational circuits C1(1) through CM(1), and applies or cuts off the ground voltage VSS to the flip-flops FN(1) through FN(1) and the combinational circuits C1(1) through CM(1) in response to the switching control signal SLEEP.

The switching circuits S1 through SK can be realized as NMOS transistors, respectively. In this case, an NMOS transistor used as a switching circuit has a leakage current smaller than the leakage current of NMOS transistors (not shown) included in the combinational circuits C1(1) through CM(K). Thus, in a state in which NMOS transistors of the switching circuits S1 through SK are turned off, that is, in a standby state of the semiconductor device 100, leakage current can be decreased.

Figure 4:
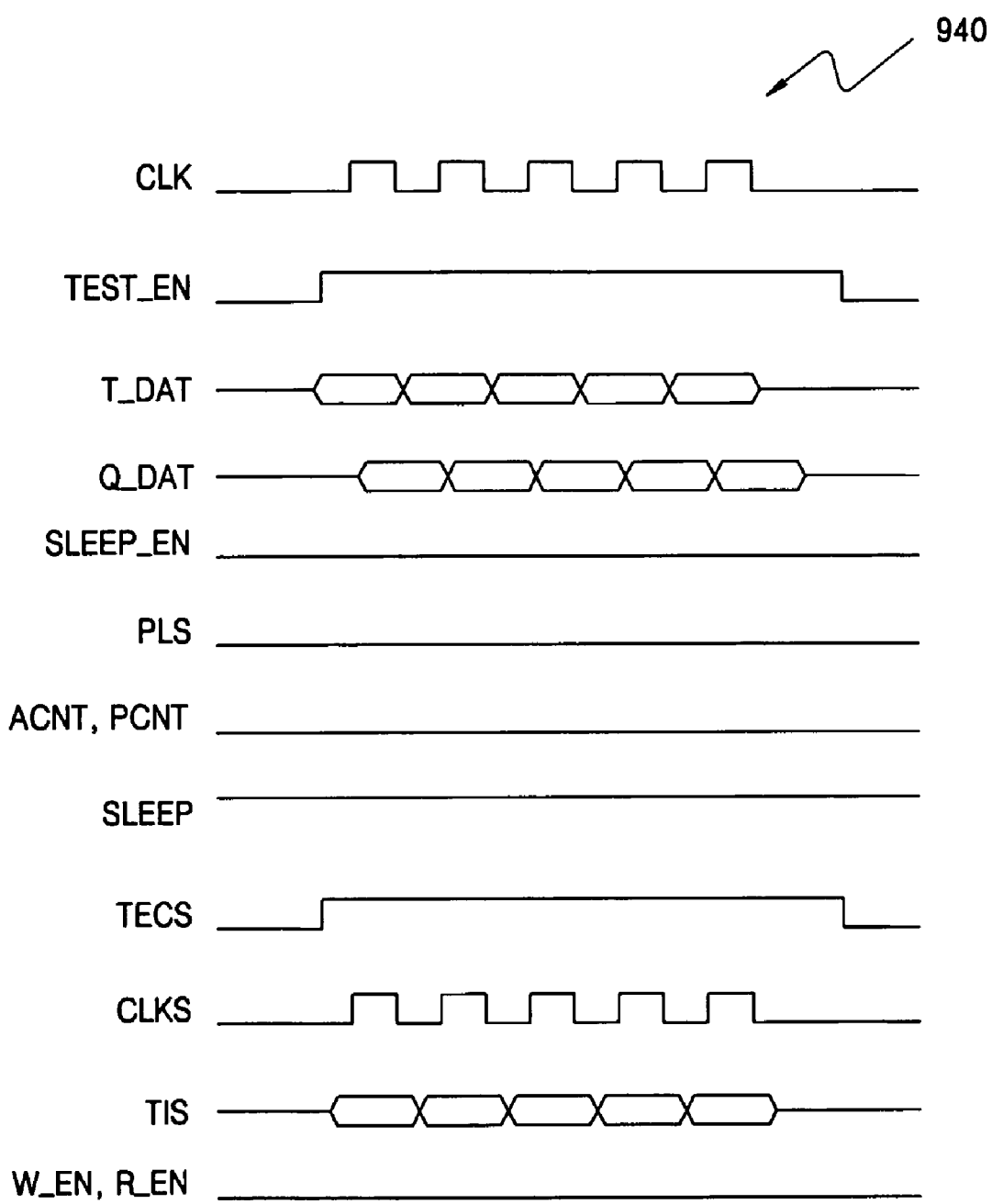
FIG. 4 is a timing diagram of main signals related to a test mode operation of the data storage circuit of FIG. 1.

Next, referring to FIGS. 4 through 6, the operation of the data storage circuit 110 in a sleep mode of the semiconductor device 100 constructed as described above is as follows. FIG. 4 is a timing diagram indicated generally by the reference numeral 940 of the main signals related to a test mode operation of the data storage circuit 110 illustrated in FIG. 1. Referring to FIG. 4, when a test control signal TEST_EN received from the outside is enabled, the sleep mode control unit 111 of the data storage circuit 110 enables a scan control signal TECS. The sleep mode control unit 111 receives and outputs a test pattern data signal T_DAT as a scan data signal TIS, and receives and outputs an external clock signal CLK as a scan clock signal CLKS. Since the scan control signal TECS is enabled, flip-flops F1(1) through FN(K) of scan chain circuits F1 through FN of the scan chain unit 112 store signals inputted to input terminals TI and the stored signals, in response to the scan clock signal CLKS. That is, flip-flops F1(1) through F1(K) of the scan chain circuit F1 receive and store bits T1 through TK, respectively, of the scan data signal TIS, and output the stored bits T1 through TK. Flip-flops F2(1) through F2(K) of the scan chain circuit F2 receive and store the bits T1 through TK of the scan data signal TIS received from the flip-flops F1(1) through F1(K), and output the stored bits T1 through TK. As described above, the bits T1 through TK pass through a scan chain circuit every cycle of the scan clock signal CLKS and are transmitted at last to flip-flops FN(1) through FN(K) of the scan chain circuit FN. The flip-flops FN(1) through FN(K) store the bits T1 through TK received from flip-flops F(N−1)(1) through F(N−1)(K) of the scan chain circuit F(N−1) and output the stored bits T1 through TK as an output data signal Q_DAT. The output data signal Q_DAT is outputted to an external test device (not shown) via an additional output pad (not shown). After that, when the test control signal TEST_EN is disabled, the sleep mode control unit 111 disables the scan control signal TECS and stops the output of the scan clock signal CLKS.

Figure 5:
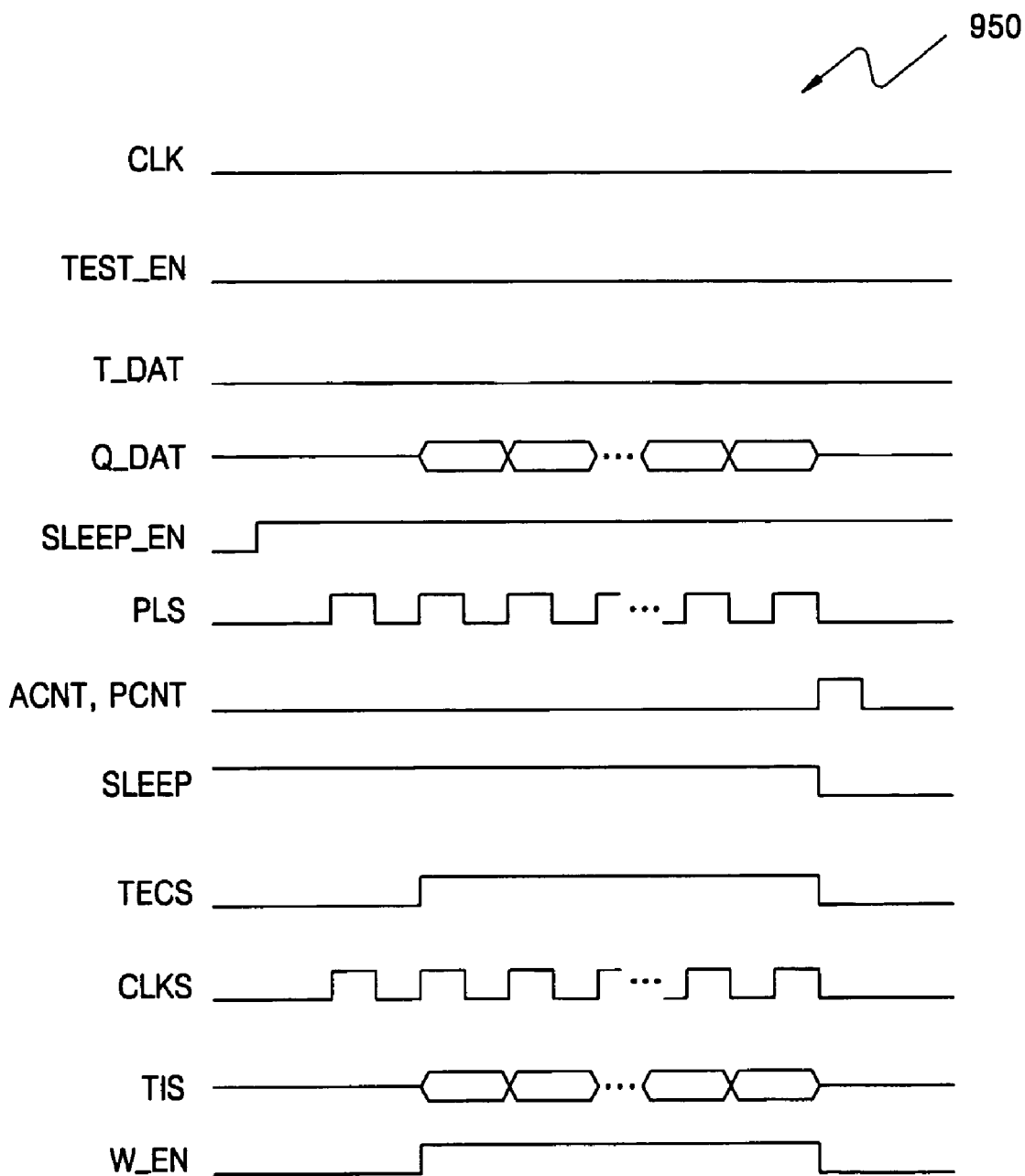
FIG. 5 is a timing diagram of main signals related to a sleep mode entering operation of the data storage circuit of FIG. 1.

FIG. 5 is a timing diagram indicated generally by the reference numeral 950 of the main signals related to a sleep mode entering operation of the data storage circuit 110 of FIG. 1. Referring to FIG. 5, when the sleep mode control signal SLEEP_EN is enabled, the pulse generator 214 of the mode switching control unit 210 generates a pulse signal PLS. Here, the pulse generator 214 starts a generation operation of the pulse signal PLS when the sleep mode control signal SLEEP_EN is transited. In response to the test control signal TEST_EN, the multiplexer 213 selects the pulse signal PLS and outputs the pulse signal PLS as the scan clock signal CLKS.

Also, when the sleep mode control signal SLEEP_EN is enabled, after a first cycle of the scan clock signal CLKS, the control signal generator 233 of the memory control unit 230 enables a write control signal W_EN.

On the other hand, during a first cycle of the scan clock signal CLKS, the scan chain circuits F2 through FN of the scan chain unit 112 receive and store normal data signals N_DAT1 through N_DATM, respectively, received from the combinational circuit groups C1 through CM of the combinational circuit unit 120 and output the stored normal data signals N_DAT1 through N_DATM as output data signals Q_DAT2 through Q_DATN. Here, since input terminals Ds of flip-flops F1(1) through F1(K) of the scan chain circuit F1 are not used, no data signals are inputted to the scan chain circuit F1.

Also, during a first cycle of the scan clock signal CLKS, the flip-flop 221 of the data output unit 220 stores the output data signal Q_DATN and outputs the stored output data signal Q_DATN as a write data signal W_DAT to the memory 130. The output data signal Q_DATN of the scan chain circuit FN is stored in the memory 130 during a second cycle of the scan clock signal CLKS.

In response to the write control signal W_EN, the OR gate 211 of the mode switching control unit 210 enables and outputs the selection signal SEL. In response to the selection signal SEL, the multiplexer 212 of the mode switching control unit 210 selects the control signal CTL and outputs the control signal CTL as the scan control signal TECS. Accordingly, the scan control signal TECS is enabled.

When the scan control signal TECS is enabled, the scan chain circuits F1 through FN store output signals of previous scan chain circuits in response to the scan clock signal CLKS. For example, the scan chain circuit F3 stores the output data signal Q_DAT2 received from the scan chain circuit F2 and outputs the stored output data signal Q_DAT2 as an output data signal Q_DAT3. Similar to this, the scan chain circuit FN stores the output data signal Q_DAT(N−1) received from the scan chain circuit F(N−1) and outputs the stored output data signal Q_DAT(N−1) as the output data signal Q_DATN. Every cycle of the scan clock signal CLKS, the scan chain circuit FN stores the output data signal Q_DAT(N−1) received from the scan chain circuit F(N−1) and outputs the stored output data signal Q_DAT(N−1). As a result, the scan chain circuit FN sequentially outputs Q_DAT(N−1), Q_DAT(N−2), . . . , Q_DAT1 as the output data signal Q_DATN every cycle of the scan clock signal CLKS. Also, the flip-flop 221 of the data output unit 220 sequentially stores Q_DAT(N−1), Q_DAT(N−2), . . . , Q_DAT1 received from the scan chain circuit FN and sequentially outputs Q_DAT(N−1), Q_DAT(N−2), . . . , Q_DAT1 as the write data signal W_DAT to the memory 130.

In response to the sleep mode control signal SLEEP_EN, the address register 231 of the memory control unit 230 outputs a start address signal SADD stored beforehand. When the sleep mode control signal SLEEP_EN is enabled, after a first cycle of the scan clock signal CLKS, the address counter 232 of the memory control unit 230 generates in synchronization with the scan clock signal CLKS an address signal MADD, which is increased gradually from the start address signal SADD, and outputs the address signal MADD to the memory 130. As a result, the write data signal W_DAT, that is, the output data signals Q_DATN, Q_DAT (N−1), Q_DAT(N−2), . . . , Q_DAT1 are sequentially stored in the storage region of the memory 130 corresponding to the address signal MADD.

The pulse counter 215 of the mode switching control unit 210 counts times the pulse signal PLS is output and accumulates the counting value. When the accumulated counting value reaches a predetermined value, the pulse counter 215 outputs a pulse stop signal PCNT to the pulse generator 214 and outputs a switching control signal SLEEP being disabled. The predetermined value of the pulse counter 215 can be predetermined as an identical value with the scan chain circuits F1 through FN, that is N. The pulse generator 214 stops the generation operation of the pulse signal PLS in response to the pulse stop signal PCNT. Also, switching circuits S1 through SK of the switching unit 113 are turned off in response to the switching control signal SLEEP, thereby cutting off the ground voltage VSS applied to the flip-flops F1(1) through FN(K) of the scan chain unit 112 and the combinational circuits C1(1) to CM(K) of the combinational circuit unit 120. Then, the operations of the flip-flops F1(1) through FN(K) and the combinational circuits C1(1) to CM(K) are stopped and switched into a standby state.

The address counter 232 counts times the address signal MADD is output, accumulates the counting value, and outputs the memory control stop signal ACNT when an accumulated counting value reaches a predetermined value. The control signal generator 233 disables the write control signal W_EN in response to the memory control stop signal ACNT. The OR gate 211 disables the selection signal SEL in response to the write control signal W_EN, and the multiplexer 212 selects and outputs the test control signal TEST_EN as the scan control signal TECS in response to the selection signal SEL. Since the test control signal TEST_EN is disabled, the scan control signal TECS is disabled.

Figure 6:
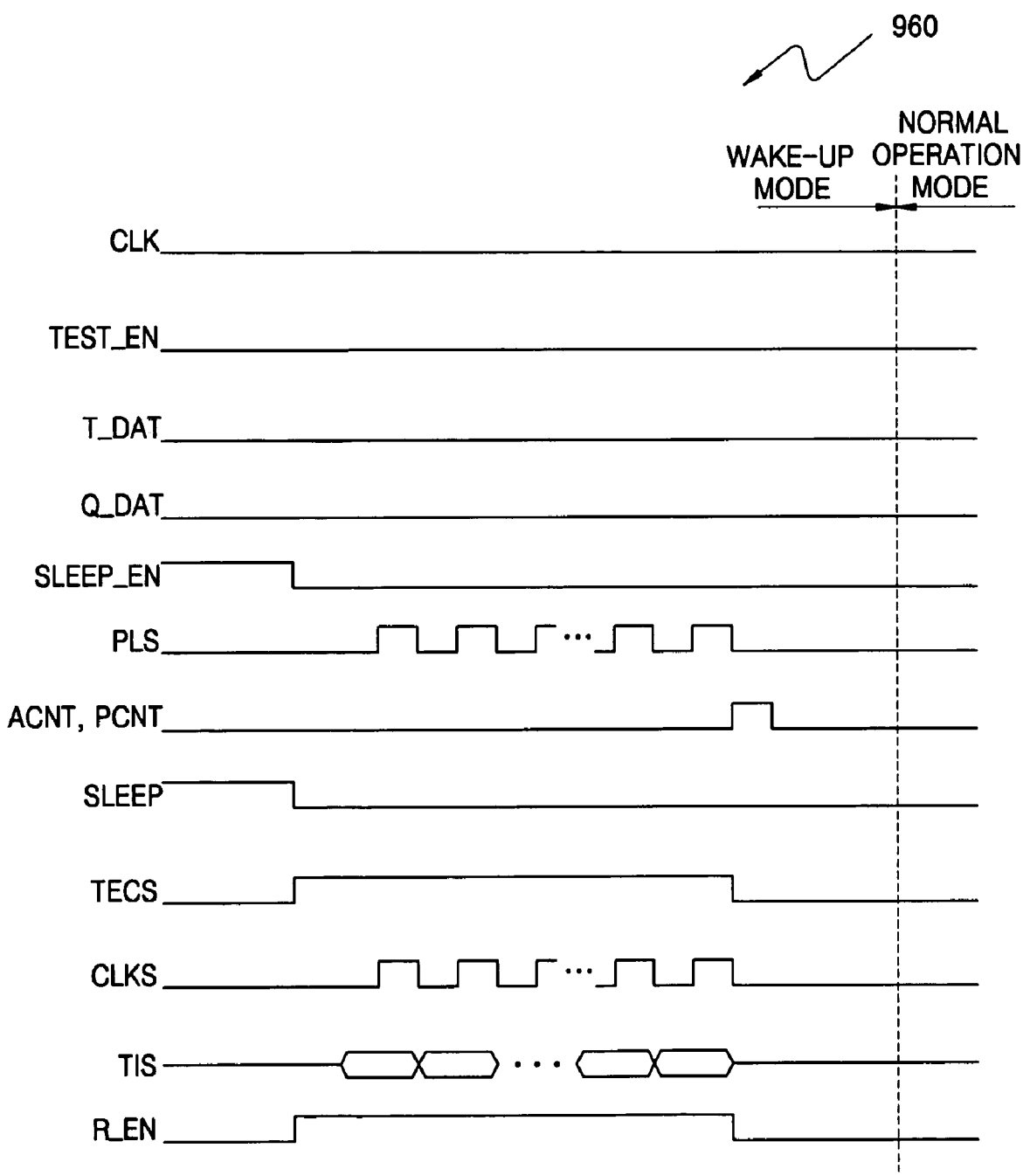
FIG. 6 is a timing diagram of main signals related to a wake-up mode operation of the data storage circuit of FIG. 1.

FIG. 6 is a timing diagram indicated generally by the reference numeral 960 of main signals related to a wake-up mode operation of the data storage circuit of FIG. 1. Here, the wake-up mode indicates a process in which the semiconductor device 100 is enabled in order to switch from a sleep mode into a normal operation mode. Referring to FIG. 6, when the sleep mode control signal SLEEP_EN is disabled, the pulse counter 215 enables the switching control signal SLEEP. The switching circuits S1 through SK are turned on in response to the switching control signal SLEEP, thereby applying the ground voltage VSS to the flip-flops F1(1) through FN(K) of the scan chain unit 112 and the combinational circuits C1(1) to CM(K) of the combinational circuit unit 120, and thus, enabling the flip-flops F1(1) through FN(K) and the combinational circuits C1(1) to CM(K).

When the sleep mode control signal SLEEP_EN is disabled, that is, when a falling edge of the sleep mode control signal SLEEP_EN is detected, the control signal generator 233 enables the read control signal R_EN. The OR gate 211 outputs the selection signal SEL at a high level in response to the read control signal R_EN. The multiplexer 212 selects and outputs the control signal CTL as the scan control signal TECS in response to the selection signal SEL. Also, the pulse generator 214 generates the pulse signal PLS in response to the sleep mode control signal SLEEP_EN, and the multiplexer 213 selects and outputs the pulse signal PLS as the scan clock signal CLKS in response to the test control signal TEST_EN.

On the other hand, the address register 231 outputs the start address signal SADD in response to the sleep mode control signal SLEEP_EN. The address counter 232 generates the address signal MADD that is gradually increased from the start address signal SADD and outputs the address signal MADD to the memory 130 in response to the sleep mode control signal SLEEP_EN. Therefore, the memory 130 outputs a read data signal R_DAT corresponding to the address signal MADD. In response to the scan clock signal CLKS, the flip-flop 222 of the data output unit 220 stores the read data signal R_DAT and outputs the stored read data signal R_DAT to the multiplexer 223 of the data output unit 220. Here, the read data signal R_DAT outputted by the flip-flop 222 every cycle of the scan clock signal CLKS is identical with the write data signal W_DAT that is stored in the memory 130 when entering the sleep mode explained referring to FIG. 5. To describe in more detail, in response to the address signal MADD, the memory 130 reads and outputs sequentially the output data signals Q_DATN, Q_DAT(N−1), Q_DAT(N−2). . . , Q_DAT1 stored sequentially as the write data signal W_DAT when entering the sleep mode. Accordingly, the flip-flop 222 stores and outputs sequentially the output data signals Q_DATN, Q_DAT(N−1), Q_DAT(N−2) . . . , Q_DAT1 received sequentially as the read data signal R_DAT.

In response to the test control signal TEST_EN, the multiplexer 223 selects the read data signal R_DAT and outputs the read data signal R_DAT as the scan chain data signal TIS to the scan chain unit 112. In more detail, the multiplexer 223 outputs sequentially the output data signals Q_DATN, Q_DAT(N−1), Q_DAT(N−2) . . . , Q_DAT1 as the scan data signal TIS.

Since the scan control signal TECS is enabled, flip-flops F1(1) through FN(K) of scan chain circuits F1 through FN of the scan chain unit 112 store a signal inputted to an input terminal TI every cycle of the scan clock signal CLKS and output the stored signal. The output data signal Q_DATN passes sequentially the scan chain circuits F1 to F(N−1) and is stored in the scan chain circuit FN. In a similar manner, the output data signal Q_DAT(N−1) passes sequentially through the scan chain circuits F1 to F(N−2) and is stored in the scan chain circuit F(N−1). Then, the scan chain circuits F1 through FN are returned to the states they were in before being switched to a sleep mode.

After this, the pulse counter 215 counts times the pulse signal PLS is output and accumulates the counting value. The pulse counter 215 outputs the pulse stop signal PCNT to the pulse generator 214 when the accumulated counting value reaches a predetermined value. The pulse generator 214 stops the generation operation of the pulse signal PLS in response to the pulse stop signal PCNT.

The address counter 232 counts times the address signal MADD is output, accumulates the counting value, and outputs the memory control stop signal ACNT when the accumulated counting value reaches the predetermined value. In response to the memory control stop signal ACNT, the control signal generator 233 disables the read control signal R_EN. In response to the read control signal R_EN, the OR gate 211 disables the selection signal SEL. In response to the selection signal SEL, the multiplexer 212 selects and outputs the test control signal TEST_EN as the scan control signal TECS. In this case, since the test control signal TEST_EN is disabled, the scan control signal TECS is disabled. After this, the scan chain circuits F1 through FN and the combinational circuits C1 through CM operate in a normal operation mode.

Figure 7:
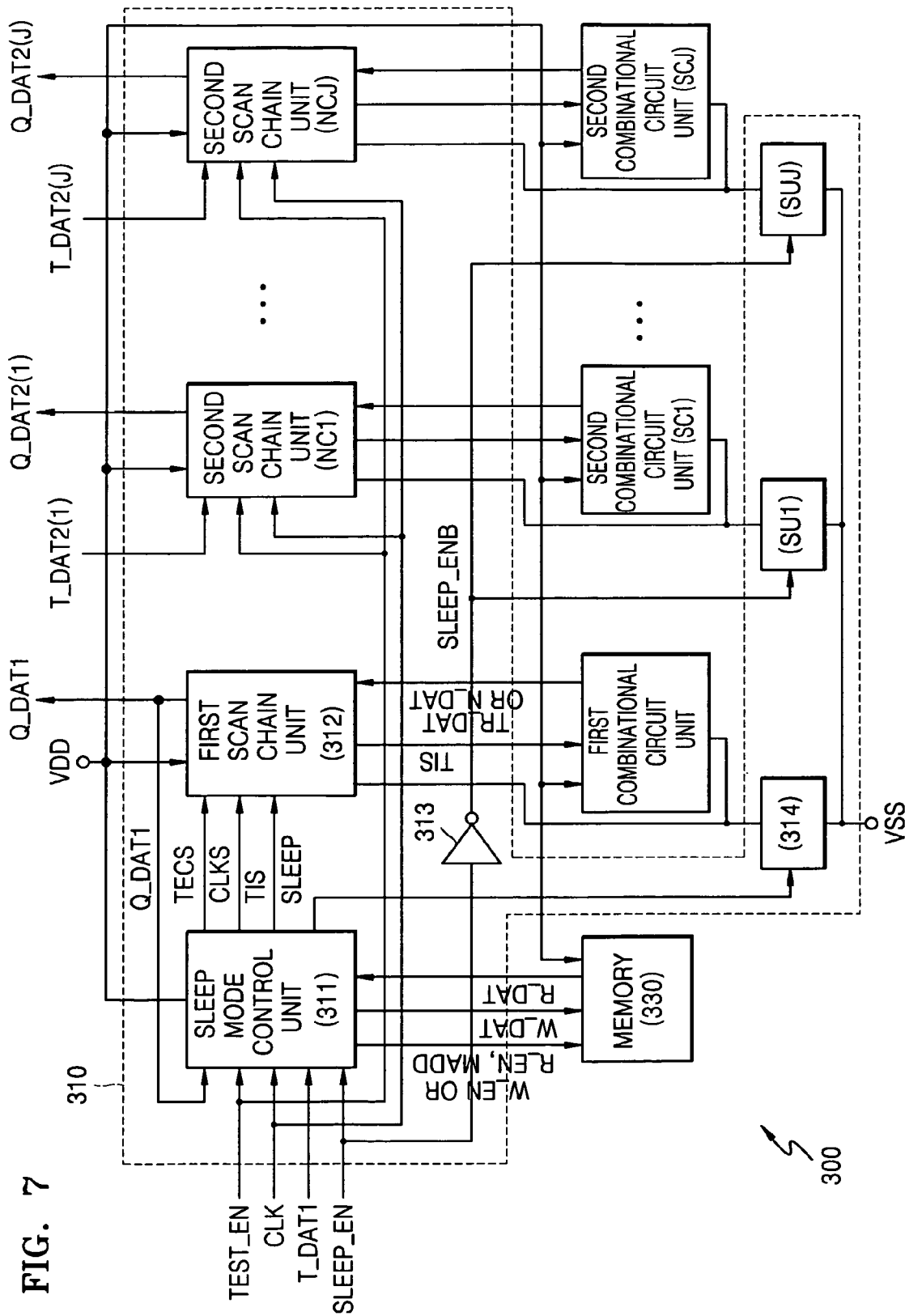
FIG. 7 is a block diagram illustrating a semiconductor device including a data storage circuit to preserve data in a sleep mode of a semiconductor device, according to another embodiment of the present disclosure.

FIG. 7 is a block diagram illustrating a semiconductor device including a data storage circuit to preserve data in a sleep mode of the semiconductor device, according to another embodiment of the present disclosure.

Referring to FIG. 7, a semiconductor device 300 includes a data storage circuit 310, a first combinational circuit unit 320, a plurality of second combinational circuit units SC1 to SCJ (where J is an integral number), and a memory 330. The data storage circuit 310 includes a sleep mode control unit 311, a first scan chain unit 312, a plurality of second scan chain units NC1 to NCJ (where J is an integral number), an inverter 313, a first switching unit 314, and a plurality of second switching units SU1 to SUJ (where J is an integral number).

Since the configuration and a concrete operation description of the operation of the sleep mode control unit 311, the first scan chain unit 312, the first switching unit 314, and the first combinational circuit unit 320 are substantially identical with the sleep mode control unit 111, the scan chain unit 112, the switching unit 113, and the combinational circuit unit 120 of FIG. 1, their configuration and operation description is omitted.

Here, when the semiconductor device 300 is switched into a normal operation mode after being switched into a sleep mode, data stored in the second scan chain units NC1 to NCJ have little effect on the operation of the semiconductor device 300. Accordingly, data stored in the second scan chain units NC1 to NCJ do not have to be stored in the memory 330. Then, when the semiconductor device 300 is switched into a sleep mode, the second scan chain units NC1 to NCJ can be simultaneously switched into a sleep mode.

The second scan chain units NC1 to NCJ are connected to the second combinational circuit units SC1 to SCJ, respectively. In response to a test control signal TEST_EN and an external clock signal CLK, the second scan chain units NC1 to NCJ receive and store test pattern data signals T_DAT2(1) to T_DAT2(J) from the outside respectively. The second scan chain units NC1 to NCJ output the stored test pattern data signals T_DAT2(1) to T_DAT2(J) to the second combinational circuit units SC1 to SCJ respectively. After this, the second scan chain units NC1 to NCJ store test result data signals TR_DAT2(1) to TR_DAT2(J), respectively, (not shown) received from the test pattern data signals T_DAT2 (1) to T_DAT2(J). The second scan chain units NC1 to NCJ output stored test result data signals TR_DAT2(1) to TR_DAT2(J), respectively, as output data signals Q_DAT2 (1) to Q_DAT2(J) via additional output pads (not shown).

The inverter 313 inverts the sleep mode control signal SLEEP_EN and outputs an inverted sleep mode control signal SLEEP_ENB. The second switching units SU1 to SUJ are connected to the second scan chain units NC1 to NCJ and the second combinational circuit units SC1 to SCJ, respectively. The second switching units SU1 to SUJ are turned on or off in response to the inverted sleep mode control signal SLEEP_ENB. When turned off, the second switching units SU1 to SUJ cut off the ground voltage VSS applied to the second scan chain units NC1 to NCJ and the second combinational circuit units SC1 to SCJ.

In more detail, when the sleep mode control signal SLEEP_EN is enabled, the second switching units SU1 to SUJ are turned off in response to the inverted sleep mode control signal SLEEP_ENB. As a result, the second scan chain units NC1 to NCJ and the second combinational circuit units SC1 to SCJ stop operating and are switched into a standby state.

Figure 8:
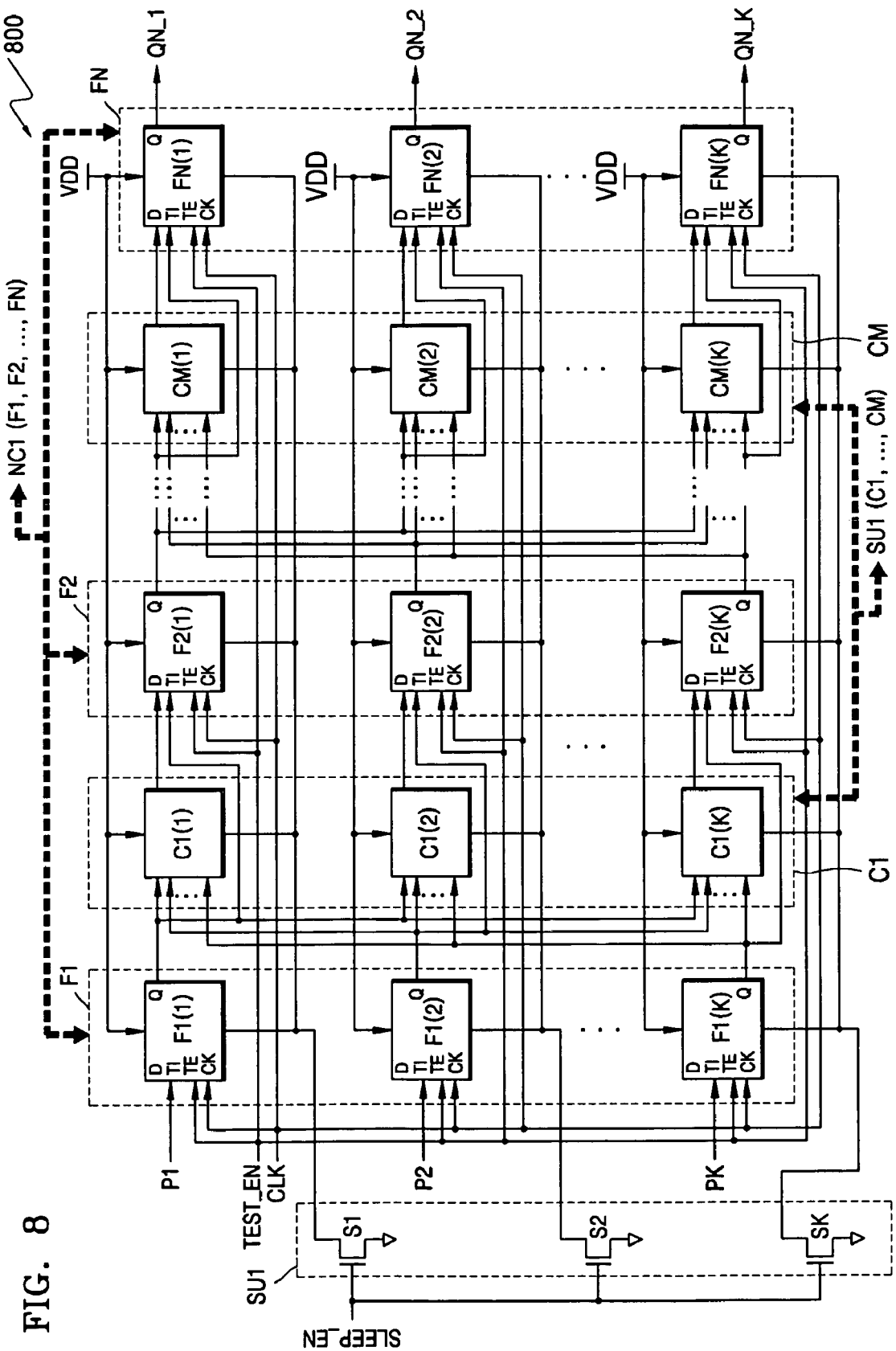
FIG. 8 is a diagram illustrating in detail a second scan chain unit, a second combinational circuit unit, and a second switching unit of FIG. 7.

FIG. 8 is a diagram indicated generally by the reference numeral 800 illustrating in detail the second scan chain unit NC1, the second combinational circuit unit SC1, and the second switching unit SU1 of FIG. 7. Here, the configuration and the exact operation of the second scan chain units NC2 to NCJ, the second combinational circuit units SC2 to SCJ, and the second switching units SU2 to SUJ are substantially identical with the second scan chain unit NC1, the second combinational circuit units SC1, and the second switching units SU1 respectively. Also, the configuration and the exact operation of the second scan chain unit NC1, the second combinational circuit units SC1, and the second switching units SU1 are substantially identical with the operation and exact operation of the scan chain unit 112, the combinational circuit unit 120, and the switching unit 113 of FIG. 3, except for the following two differences. Therefore, only the two differences will now be described.

A first difference is that the test control signal TEST_EN and the external clock signal CLK are inputted to the entire flip-flops F1(1) through FN(K) of the second scan chain units NC1. A second difference is that the second switching unit SU1 is turned on or off in response to the sleep mode control signal SLEEP_EN.

Figure 9:
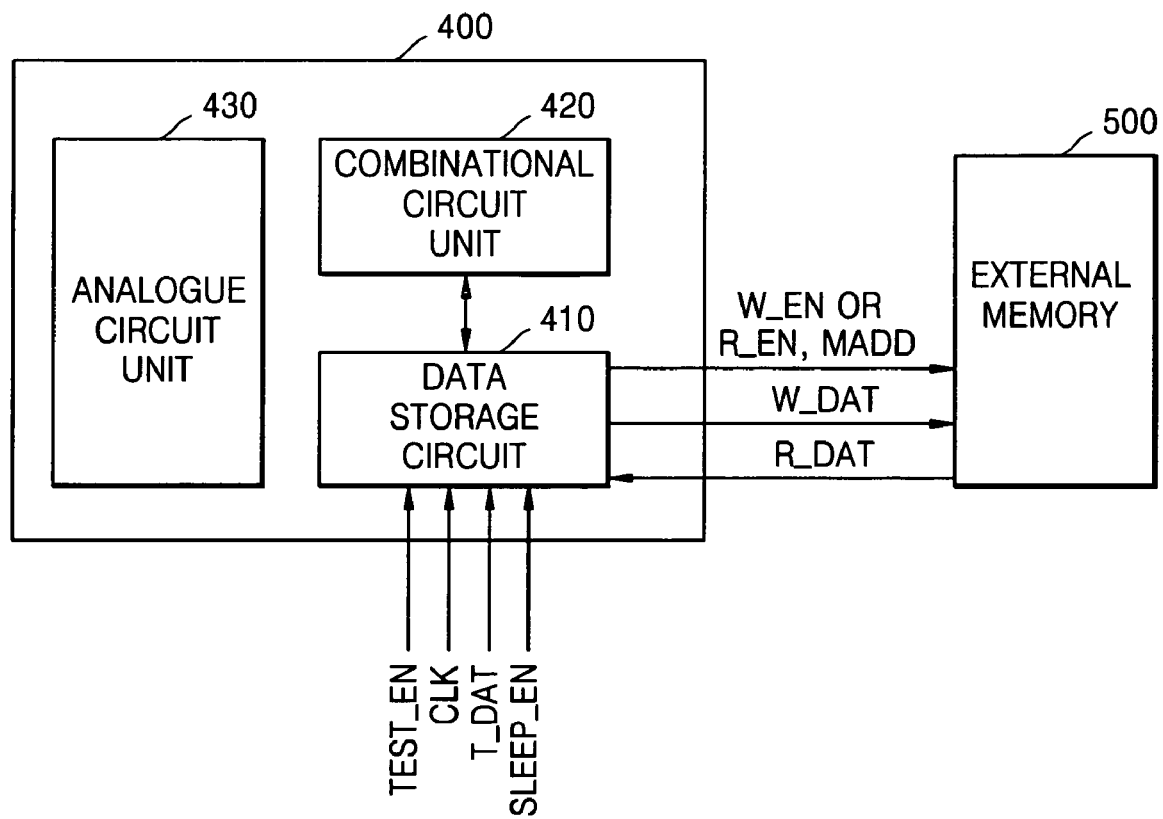
FIG. 9 is a block diagram illustrating a semiconductor device including a data storage circuit to preserve data in a sleep mode of a semiconductor device, according to still another embodiment of the present disclosure and an external memory.

FIG. 9 is a block diagram illustrating a semiconductor device including a data storage circuit to preserve data in a sleep mode of a semiconductor device, according to still another embodiment of the present disclosure, and an external memory. Referring to FIG. 9, a semiconductor device 400 includes a data storage circuit 410, a combinational circuit unit 420, and an analog circuit unit 430. The configuration and the operation of the data storage circuit 410 and the combinational circuit unit 420 are substantially the same as the configuration and the operation of the data storage circuit 110 and the combinational circuit unit 120, except for one difference: the data storage circuit 410 stores data of an internal scan chain unit (not shown) in an external memory 500 when entering a sleep mode. That is, when entering a sleep mode, the data storage circuit 410 outputs a write control signal W_EN, an address signal MADD, and a write data signal W_DAT to the external memory 500. When being switched from a sleep mode into a normal operation mode, the data storage circuit 410 outputs a read control signal R_EN and the address signal MADD to the external memory 500 and receives a read data signal R_DAT from the external memory 500. As described above, when the semiconductor device 400 does not include a memory, the data storage circuit 410 can store data of the scan chain unit in the external memory 500 when entering a sleep mode.

As described above, the circuit and the method for preserving data in a sleep mode of a semiconductor device, according to embodiments of the present disclosure, have effects in which a loss of data is prevented and power consumption in a standby state is reduced because data generated by an internal circuit in normal operation are stored in advance before the semiconductor device is switched into a sleep mode.

Also, the circuit and the method for preserving data in a sleep mode of a semiconductor device, according to embodiments of the present disclosure, have effects in which since a test scan chain embedded in a semiconductor device is used, and additional circuits are not required, thereby reducing the manufacturing cost of the semiconductor device.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A semiconductor device having a sleep mode function, the device comprising a data storage circuit for preserving data when the semiconductor device is in the sleep mode, the data storage circuit comprising:
   a sleep mode control unit for outputting a scan control signal and a scan clock signal in response to one of a test control signal and a sleep mode control signal received from the outside, storing a first output data signal in a memory when the first output data signal is received, and outputting a first test pattern data signal as a scan data signal when the first test pattern data signal is received; and
   a first scan chain unit in signal communication with the sleep mode control unit for at least one of outputting a first normal data signal stored inside of the scan chain unit as the first output data signal to the sleep mode control unit in response to the scan control signal and the scan clock signal, and receiving and outputting the scan data signal to a first combinational circuit unit.

2. The data storage circuit of claim 1, wherein the sleep mode control unit:
   is switched into a sleep mode or a normal operation mode in response to the sleep mode control signal;
   reads the normal data signal stored in the memory when being switched from the sleep mode into the normal operation mode; and
   outputs the normal data signal as the scan data signal to the scan chain unit.

3. The data storage circuit of claim 1, wherein the sleep mode control unit further generates a switching control signal in response to the sleep mode control signal.

4. The data storage circuit of claim 3, further including a switching unit which is turned on or off in response to the switching control signal and, when turned off, cuts off a ground voltage applied to the scan chain unit and the combinational circuit unit.

5. The data storage circuit of claim 4, wherein the sleep mode control unit:
   is switched into a sleep mode or a normal operation mode in response to the sleep mode control signal;
   disables the switching control signal when all of the normal data signal is stored in the memory in the sleep mode; and
   enables the switching control signal when switched into the normal operation mode,
   wherein the switching unit is turned off when the switching control signal is disabled.

6. The data storage circuit of claim 1, wherein the sleep mode control unit further receives an external clock signal when the test control signal is received and outputs the external clock signal as the scan clock signal.

7. The data storage circuit of claim 1, wherein the scan chain unit:

outputs the normal data signal as the output data signal to the sleep mode control unit in response to the scan clock signal when the scan data signal is not received;

outputs the scan data signal to the combinational circuit unit in response to the scan clock signal when the scan data signal is received; and outputs a test result data signal received from the combinational circuit unit as the output data signal to the outside via an output pad.

8. The data storage circuit of claim 4, wherein the sleep mode control unit comprises:

a mode switching control unit that outputs the scan control signal, the scan clock signal, and the switching control signal in response to the test control signal, the sleep mode control signal, and the external clock signal;

a data output unit which outputs one of the scan data signal and the write data signal in response to the test control signal, the scan clock signal, the test pattern data signal, a write data signal, and the output data signal; and a memory control unit that outputs one of a write control signal and a read control signal and an address signal to the memory in response to the sleep mode control signal and the scan clock signal.

9. The data storage circuit of claim 8, wherein the mode switching control unit comprises:

a first multiplexer which selects and outputs one of the test control signal and a control signal as the scan control signal in response to a selection signal;

a second multiplexer which selects and outputs one of the external clock signal and a pulse signal as the scan clock signal in response to the test control signal;

a pulse generator which generates the pulse signal in response to the sleep mode control signal and stops generating the pulse signal in response to a pulse stop signal; and a pulse counter which counts times the pulse signal is output to accumulate a counting value and outputs the switching control signal and the pulse stop signal when an accumulated counting value reaches a predetermined value, wherein the control signal has an internal voltage level.

10. The data storage circuit of claim 9, wherein the mode switching control unit further includes an OR gate which outputs the selection signal in response to the write control signal and the read control signal.

11. The data storage circuit of claim 8, wherein the data output unit comprises:

a first flip-flop that stores the output data signal received from the scan chain unit and outputs the stored output data signal as the write data signal to the memory in response to the scan clock signal;

a second flip-flop which stores the read data signal received from the memory and outputs the stored read data signal in response to the scan clock signal; and a multiplexer which selects and outputs one of the test pattern data signal and the read data signal as the scan data signal in response to the test control signal.

12. The data storage circuit of claim 8, wherein the memory control unit comprises:

an address register that stores a start address signal, and outputs the start address signal in response to the sleep mode control signal;

an address counter which generates the address signal based on the start address signal in response to the sleep mode control signal and the scan clock signal and generates a memory control stop signal in response to the scan clock signal; and a control signal generator which enables one of the write control signal and the read control signal in response to the sleep mode control signal and the scan clock signal and disables the enabled one of the write control signal and the read control signal in response to the memory control stop signal.

13. The data storage circuit of claim 8, wherein:

the combinational circuit unit include first through Mth (where M is an integral number.) combinational circuit groups that include K (where K is an integral number.) combinational circuits respectively;

the scan chain unit includes first through Nth (where N is an integral number.) scan chain circuits, which are alternately arranged between the first through Mth combinational circuit groups;

the normal data signal includes a first to Mth normal data signals; and the output data signal includes a first to Nth output data signals, in which the first scan chain circuit receives the scan data signal, stores the scan data signal, and outputs the stored scan data signal as the first output data signal in response to the scan control signal and the scan clock signal.

14. The data storage circuit of claim 13, wherein the second to Nth scan chain circuits:

receive and store the first to Mth normal data signals or the first through (N−1)th output data signals in response to the scan control signal and the scan clock signal; and output stored signals as the second to the Nth output data signals respectively.

15. The data storage circuit of claim 13, wherein each of the first to Nth scan chain circuits include K flip-flops.

16. The data storage circuit of claim 13, wherein the switching unit is turned on or off in response to the switching control signal and includes a plurality of switching circuits, which cut off the ground voltage applied to the combinational circuits of the first to Mth combinational circuit groups and to the first to Nth scan chain circuits when the plurality of switching circuits are turned off.

17. The data storage circuit of 16, wherein each of the switching circuits include a transistor, and a leakage current of the transistor is smaller than a leakage current of a transistor included in the combinational circuits.

18. The data storage circuit of 14, wherein when the sleep mode control signal is enabled, the second to Nth scan chain circuits repeatedly perform operations (N−1) times, in which the second to Nth scan chain circuits receive the first to (N−1) output data signals, store the first to (N−1) output data signals, and output stored signals as the second to Nth output data signals respectively;

when the sleep mode control signal is enabled, the data output unit:

receives the Nth output data signal as the first write data signal from the Nth scan chain circuit;

outputs the Nth output data signal to the memory;

receives the first output data signal as the last write data signal; and outputs the first output data signal to the memory, and when the sleep mode control signal is disabled, the data output unit:

receives the Nth output data signal from the memory as the first read data signal;

outputs the Nth output data signal as the scan data signal;

receives the first output data signal as the last read data signal; and outputs the first output data signal as the scan data signal.

19. The data storage circuit of claim 1, wherein the memory is embedded in the semiconductor device.

20. The data storage circuit of claim 1, wherein the memory is connected to the outside of the semiconductor device.

21. A semiconductor device as defined in claim 1, further comprising:

at least one second scan chain unit in signal communication with the sleep mode control unit for storing second to Jth (where J is an integral number) test pattern data signals, outputting the stored second to Jth test pattern data signals to second combinational circuit units, respectively, and outputting test result data signals received respectively from the second combinational circuit units to the outside via output pads in response to the test control signal and external clock signal.

22. The data storage circuit of claim 21, wherein the sleep mode control unit further generates a switching control signal in response to the sleep mode control signal.

23. The data storage circuit of claim 22, further comprising:

a first switching unit which is turned on or off in response to the switching control signal and, when turned off, cuts off a ground voltage applied to the first scan chain unit and the first combinational circuit unit;

an inverter that inverts the sleep mode control signal and outputs an inverted sleep mode control signal;

second switching units which are turned on or off in response to the inverted sleep mode control signal and, when turned off, cut off the ground voltage applied to the second scan chain units and the second combinational circuit units.

24. The data storage circuit of claim 23, wherein each of the first switching unit and the second switching units include a plurality of transistors, and leakage currents of the plurality of transistors are smaller than leakage currents of transistors included in the first combinational circuit unit and the second combinational circuit units.

25. A method of preserving data when a semiconductor device is in a sleep mode, the method comprising:

when a sleep mode control signal is enabled, storing data signals received from a first scan chain unit in a memory;

when all data signals are stored in the memory, stopping applying a ground voltage to the first scan chain unit and a first combinational circuit unit;

when the sleep mode control signal is disabled, applying the ground voltage to the first scan chain unit and the first combinational circuit unit; and after the operation of applying the ground voltage, reading the data signals stored in the memory and outputting the data signals to the first scan chain unit.

26. A method as defined in claim 25, further comprising:

when a sleep mode control signal is enabled, stopping application of a ground voltage to the first scan chain unit and the first combinational circuit unit;

when a sleep mode control signal is enabled, storing data signals received from a second scan chain unit in a memory;

when all data signals are stored in the memory, stopping applying a ground voltage to the second scan chain unit and a second combinational circuit unit;

when the sleep mode control signal is disabled, applying the ground voltage to the second scan chain unit and the second combinational circuit unit; and after the operation of applying the ground voltage, reading the data signals stored in the memory and outputting the data signals to the second scan chain unit.

27. A data storage circuit comprising:

control means for outputting a scan control signal and a scan clock signal in response to at least one of a test control signal and a sleep mode control signal, storing a first output data signal when the first output data signal is received, and outputting a first test pattern data signal as a scan data signal when the first test pattern data signal is received; and chain means in signal communication with the control means for at least one of outputting a first normal data signal stored inside of the chain means as a first output data signal to the control means in response to the scan control signal and the scan clock signal, and receiving and outputting the scan data signal.

* * * * *